United States Patent [19]
Connolly et al.

[11] Patent Number: 5,745,914
[45] Date of Patent: Apr. 28, 1998

[54] TECHNIQUE FOR CONVERTING SYSTEM SIGNALS FROM ONE ADDRESS CONFIGURATION TO A DIFFERENT ADDRESS CONFIGURATION

[75] Inventors: Brian J. Connolly, Williston; Timothy Jay Dell, Colchester; Bruce Gerard Hazelzet; Mark William Kellogg, both of Essex Junction, all of Vt.

[73] Assignee: International Business Machines Corporation, Armonk, N.Y.

[21] Appl. No.: 770,924

[22] Filed: Dec. 20, 1996

Related U.S. Application Data

[63] Continuation-in-part of Ser. No. 598,857, Feb. 9, 1996.
[51] Int. Cl.$^6$ .................................................. G06F 12/00
[52] U.S. Cl. ........................... 711/105; 711/3; 711/5; 711/106; 365/222; 365/230.03; 365/230.06
[58] Field of Search ............................ 365/222, 230.03, 365/230.06; 395/405, 433, 632; 711/3, 5, 106

[56] References Cited

U.S. PATENT DOCUMENTS

| | | | |
|---|---|---|---|
| 4,322,825 | 3/1982 | Nagami | 365/203 |
| 4,641,281 | 2/1987 | Mashiko et al. | 365/189.01 |
| 4,656,605 | 4/1987 | Clayton | 365/52 |
| 4,742,474 | 5/1988 | Knierim | 345/187 |
| 4,882,700 | 11/1989 | Mauritz et al. | 365/51 |
| 5,161,218 | 11/1992 | Catlin | 395/402 |
| 5,241,643 | 8/1993 | Durkin et al. | 395/442 |
| 5,253,357 | 10/1993 | Allen et al. | 395/442 |
| 5,260,892 | 11/1993 | Testa | 365/63 |
| 5,270,964 | 12/1993 | Bechtolsheim et al. | 365/52 |
| 5,272,664 | 12/1993 | Alexander et al. | 365/52 |
| 5,278,801 | 1/1994 | Dresser et al. | 365/230.02 |
| 5,327,387 | 7/1994 | Sugiura et al. | 365/222 |
| 5,345,577 | 9/1994 | Chan et al. | 395/433 |
| 5,357,624 | 10/1994 | Lavan | 395/442 |
| 5,371,866 | 12/1994 | Cady | 395/421.01 |
| 5,414,670 | 5/1995 | Schaefer | 365/230.03 |
| 5,418,754 | 5/1995 | Sakakibara | 365/222 |
| 5,475,829 | 12/1995 | Thome | 395/479 |
| 5,537,555 | 7/1996 | Landry et al. | 395/306 |
| 5,600,604 | 2/1997 | Chen | 365/230.06 |

FOREIGN PATENT DOCUMENTS

| | | |
|---|---|---|
| 0482575A2 | 4/1992 | European Pat. Off. |
| 63-56898 | 3/1988 | Japan . |
| 64-32490 | 2/1989 | Japan . |
| 5-109270 | 4/1993 | Japan . |

OTHER PUBLICATIONS

"Stacking Single Inline Memory Module Card," IBM Technical Disclosure Bulletin, vol. 37, No. 10. Oct., 1994.

*Primary Examiner*—Tod R. Swann
*Assistant Examiner*—Denise Tran
*Attorney, Agent, or Firm*—Calfee, Halter & Griswold LLP

[57] ABSTRACT

A method and logic circuit are provided which method and logic circuit allow both a CBR and hidden refresh to take place on DRAM's populating SIMM's or DIMM's, wherein both a single system RAS and single system CAS are converted to multiple RAS's and multiple CAS's for normal read/write operation on the DRAM's.

8 Claims, 6 Drawing Sheets

TECHNIQUE FOR CONVERTING SYSTEM SIGNALS FROM ONE ADDRESS CONFIGURATION TO A DIFFERENT ADDRESS CONFIGURATION

RELATED APPLICATIONS

The present application is a continuation-in-part of application Ser. No. 08/598,857, filed Feb. 9, 1996, and entitled "High Density SIMM or DIMM with RAS Address Re-Mapping" (Attorney Docket No. BU9-95-095).

BACKGROUND OF THE INVENTION

This invention relates generally to a method and apparatus for converting system signals and addresses from one configuration to a different configuration for use on DRAM memories. In more particular aspects, this invention relates to converting a single master or system RAS signal and the high order bit of a row address generated by a computer system from one configuration of memory addressing to two RAS signals and converting a System CAS signal and an address bit to the CAS signals useful in the system for a different memory addressing scheme and supporting both CBR refresh and hidden refresh.

High density memory systems are utilized to maximize performance in many PC server and work station environments. However, certain technological advances are costly to implement, and for certain implementations it is desirable to use less costly technology interchangeably with certain system configurations which can use higher technology. For example, sometimes it is desirable to use 16-meg chips with systems that support 64-meg technology. In such a configuration, a 64 or 72 bit wide data bus using 64-megabit (8M×8) chips can be used. If the system is designed for 8M×8 chips, the JEDEC standard is for a 12×11 address scheme (i.e., 12 row address bits and 11 column address bits). In such a scheme, only one bank is required to read all 64 or 72 bits, and thus only a single RAS signal is needed.

However, 64 megabit chips generally utilize 3.3 volt technology which for several reasons is quite expensive and thus, while fewer chips can be used to store the same information, these fewer chips in the aggregate are more expensive than using 16 megabit chips manufactured in 5-volt technology. For example, eight 8M×8 chips can be used to store the same amount of information as is stored in 32 4M×4 chips. However, under certain marketing conditions, the 32 4M×4 chips can be much cheaper in the aggregate than the eight 8M×8 chips, and thus for many applications, even though more chips are involved, it is desirable to use the 5-volt technology and 4M×4 chips.

Unfortunately, to achieve the same addressable space, 2 banks of 4M×4 DRAM chips are required which have an address configuration of 11 bit row addresses by 11 bit column addresses (11/11) but require 2 RAS signals to actuate the entire range. Expressed another way, 2 banks of 16 11×11 addressable 4M×4 DRAMs (for a total of 32 DRAMs) are necessary to provide the equivalent 8M address steps of 1 bank of 12/11 addressable 8M×8 DRAMs. Addressing of the CAS also requires two CAS signals and the system provides only one.

Moreover, the standard refresh technique for the 8M×8 technology using 3.3 volts is a CAS Before RAS (CBR) cycle and also often hidden refresh. The current invention relates to CBR and hidden refresh implementations.

SUMMARY OF THE INVENTION

According to the present invention, a method and logic circuit are provided which allow both a CBR and hidden refresh to take place on DRAM's populating SIMM's or DIMM's, wherein both a single system RAS and single system CAS are converted to multiple RAS's and multiple CAS's for normal read/write operation on the DRAM's.

DESCRIPTION OF THE PREFERRED EMBODIMENT(S)

The preferred embodiment will be described in the environment of an IBM personal computer using an Intel 80386 or 80486 or Pentium Microprocessor with Dual Inline Memory Modules (DIMMs) having Dynamic Random Access Memory (DRAM) chips to provide and control the memory's function. The memory modules can also be Single Inline Memory Modules (SIMMs) instead of DIMMs—the difference between DIMMs and SIMMs being that SIMMs have two rows of contacts (one on each side of the assembly), which opposing contacts are tied together. DIMMs also have two rows of contacts, but these are not tied together, allowing a greater number of unique I/O's in the same physical space. Functionally for the purposes of this invention, SIMMs and DIMMs are the same. (A SIMM or DIMM is sometimes referred to as a DRAM card, which means the DRAM and all the chips and circuits on the SIMM or DIMM.) For the purpose of this description, the system will be described as it is used with a CPU capable of generating parity bits for each of the data bytes that it writes, and also reading and comparing parity information read from storage, although such parity generation is not essential for the purpose of the present invention.

Figure 1:
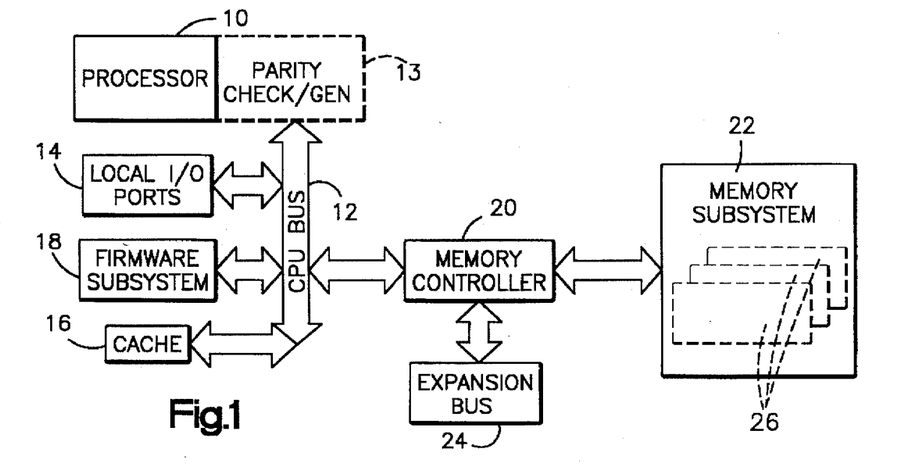
FIG. 1 is a high level diagram showing the interconnections of a personal computer with a bus and an add-on memory card according to this invention.

As can be seen in FIG. 1, there is provided a CPU 10 which is connected to a CPU or system bus 12. A parity generation and check unit 13 preferably is provided which also generates or checks parity of data being either written by or read by the CPU 10 to or from the bus 12. The CPU bus 12 may also have local I/O ports 14, CACHE memory 16 and firmware or other subsystems 18 associated therewith. A memory controller 20 is also connected to the system bus 12, coupling it to a memory subsystem 22, and to an expansion bus 24, if one is present. The memory subsystem 22 is typically comprised of one or more DIMMs 26 (or SIMMs), each of which is provided with DRAM chips. (DRAMs require periodic refresh operations, as opposed to SRAMs which do not require refresh.) It is to be understood that the system as described is illustrative of systems on which the configuration of the DRAM chips and utilization of the signals can be used, but other systems can function in conjunction with the SIMMs or DIMMs having the DRAM configuration of the present invention.

As indicated, the CPU 10 is capable of writing data onto the bus 12, which in turn will be conveyed to the correct memory addresses in the subsystem 22 by a memory controller 20. Upon writing data by the CPU 10, parity bits are generated for each byte of information written to memory by the parity generating and checking device 13 which also checks parity on information read from the memory subsystem 22 during a read cycle to determine if there is parity error. The memory controller 20 also provides the necessary signals, such as the Row Activation Strobe (RAS), one of which is generated in the present case, Column Activation Strobe (CAS), Write Enable (WE) and, on some systems, Output Enable (OE) and Byte Select (BS), as well as others not shown, to the memory subsystem 22. The memory controller reads and writes both data and parity to/from each DIMM 26. It should be understood that the invention is applicable to a wide variety of SIMMs or DIMMs having many different form factors, although it is particularly useful for a 72-pin SIMM or a 168-pin DIMM which is configured having the DRAMs actuated by a single system RAS (SYS RAS) signal as will be explained presently.

Figure 2:
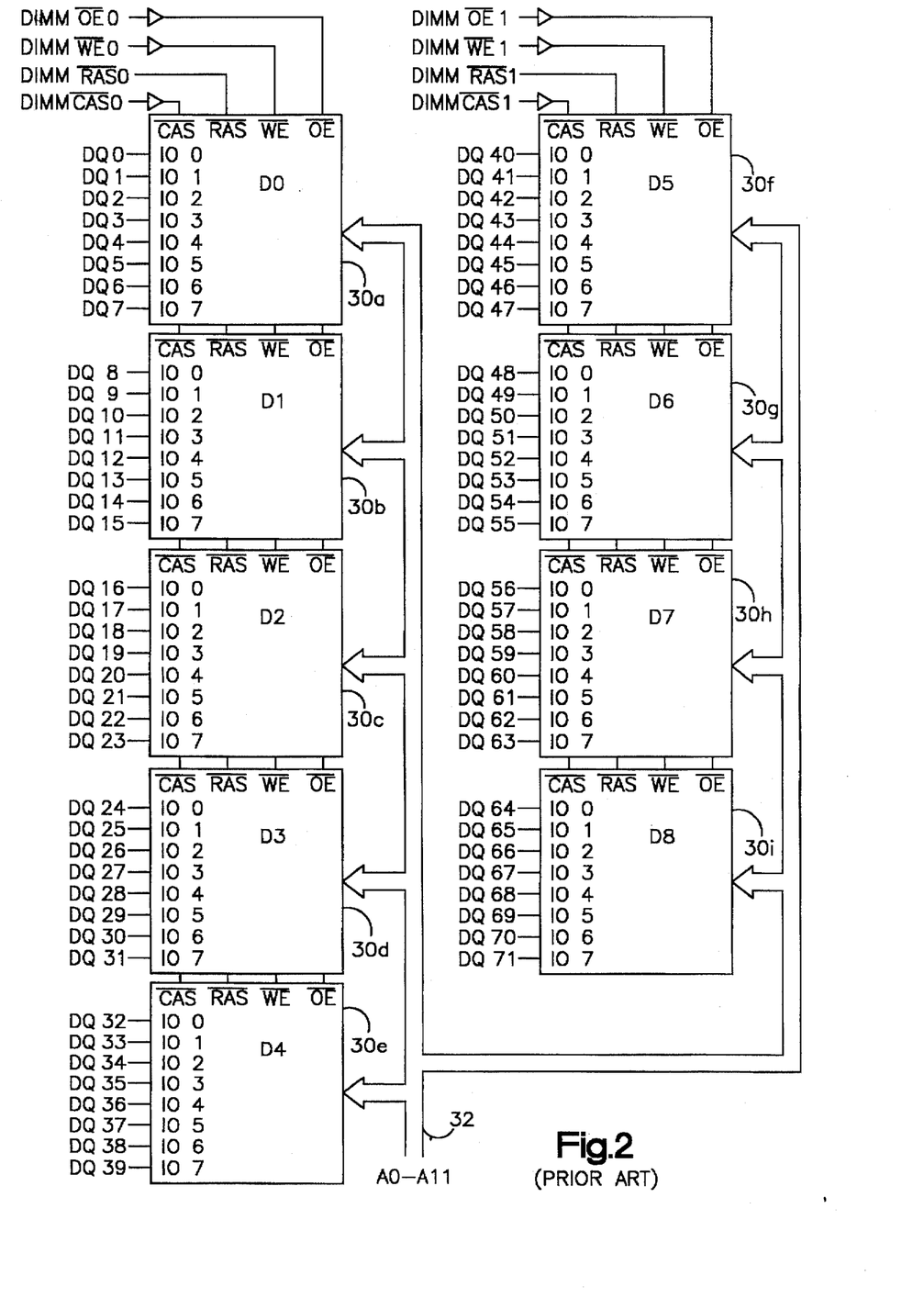
FIG. 2 is a block diagram, somewhat schematic, of the configuration of a DIMM (Dual In-Line Memory Module) utilizing 8M×8 chips to achieve 64 megabytes storage with a 12/11 address configuration.

Referring now to FIG. 2, one typical design of a SIMM or DIMM 26 utilizing 9 8M×8 DRAM chips and a 168 pin DIMM configuration is shown. Conventionally, the configuration uses 64 pins (i.e., pins DQ0–DQ63) as data pins and 8 pins (e.g. DQ64–71) for parity or ECC bits if they are present. If parity and/or ECC bits are not present or need not be stored, then 8 DRAMs rather than 9 can be used. As can be seen in FIG. 2, the DRAMs 30a–30i are arranged in a configuration wherein a single DIMM RAS signal will actuate all of the DRAMs on a read or write cycle, as well as a single RAS actuating the DRAMs on a refresh cycle. Typically, the system of this configuration will do a refresh as a CAS Before RAS (CBR) function, although RAS Only Refresh (ROR) can also be used. However, the present invention is designated for use in applications using CAS Before RAS refresh operation.

During a read or write cycle, the chips are addressed by an address bus having 12 row addresses which are delivered on an address bus 32 as address bits A0–A11. As indicated above, the addressable configuration of the DRAMs 30a–30i is 12/11, i.e., 12 row addresses by 11 column addresses, allowing the storage of 8 megabytes of memory on each DRAM. Thus, the 8 DRAMs 30a–30h used to store the data which is on lines DQ0–DQ63 can store 64 megabytes of data, whereas the remaining DRAM chip 30i can store 8 megabytes of ECC bits. Of course, other storage configurations could be used wherein the data bits, parity or ECC bits are stored together with the respective bytes to which they apply if the parity or ECC is generated on a byte-by-byte basis. As indicated above, the technology used for the manufacture of DRAMs 30a–30i employs very fine lines and thin layers of oxide to achieve this device density; thus, for these and other reasons, these chips are expensive, and while they do function, nevertheless in certain applications it is desirable to use less expensive chips manufactured in 5-volt technology which does not require such close process control, especially in the oxide thickness of the gates of the transistors and device sizes. Moreover, many systems support only 5-volt technology.

Figure 3:
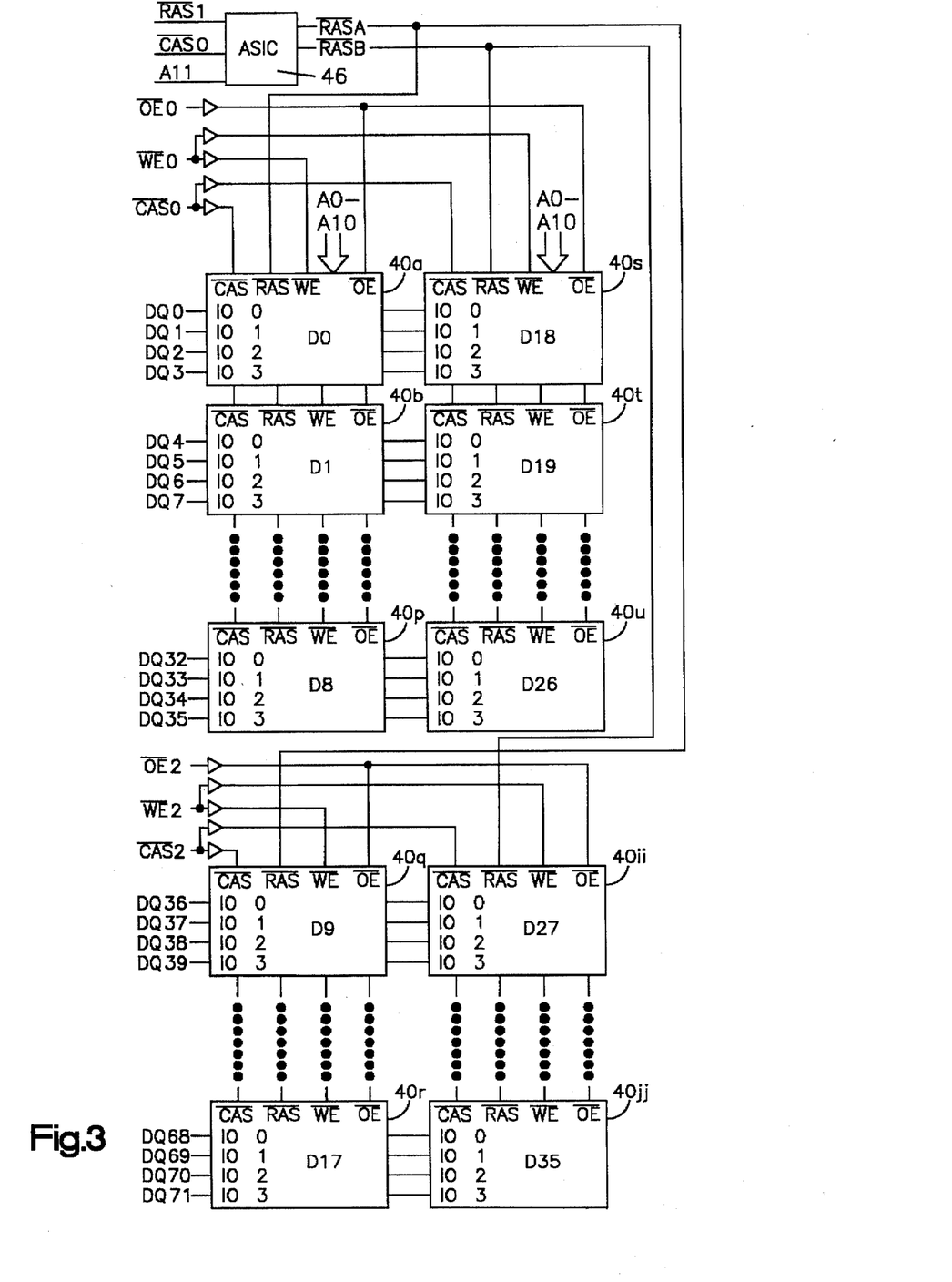
FIG. 3 is a block diagram, somewhat schematic, showing the use of 32 4M×4 chips on a DIMM using an address configuration of 11/11 to achieve 64 megabytes storage capacity.

Referring now to FIG. 3, a block diagram of a 64-meg DIMM is shown. FIG. 3 shows how 64 megabytes of memory storage can be achieved using 2 banks of 4M×4 DRAMs which can be produced using 5-volt technology. An additional four 4M×4 chips are provided to store parity or ECC bits if they are required. As indicated above, in the aggregate, the cost of the 32 4M×4 chips under certain marketing conditions can be much less than the cost of eight 8M×8 chips. To achieve the 64 megabytes of memory plus 8 megabytes of storage for ECC or parity bits, 2 banks of 4M×4 DRAMs 40a–40jj are provided. (Some of the chips are indicated only by dots, but they are the same configuration as those chips shown.) Chips 40a–40r constitute one bank, and the chips 40s–40jj constitute a second bank. Since the chips are each 4M×4, it is required to have 4 chips to achieve the same storage capability as 1 chip of the 8M×8 configuration shown in FIG. 2. Moreover, to achieve the same depth of storage, the chips of the 4M×4 configuration are utilized in pairs, such as 40a and 40s constituting a pair, 40b and 40t constituting a pair, through 40r and 40jj constituting a pair. Thus, the chips 40a, 40b, 40s and 40t store the same amount of data as a single chip 30a of the embodiment shown in FIG. 2 utilizing an 8M×8 configuration.

Figure 4:
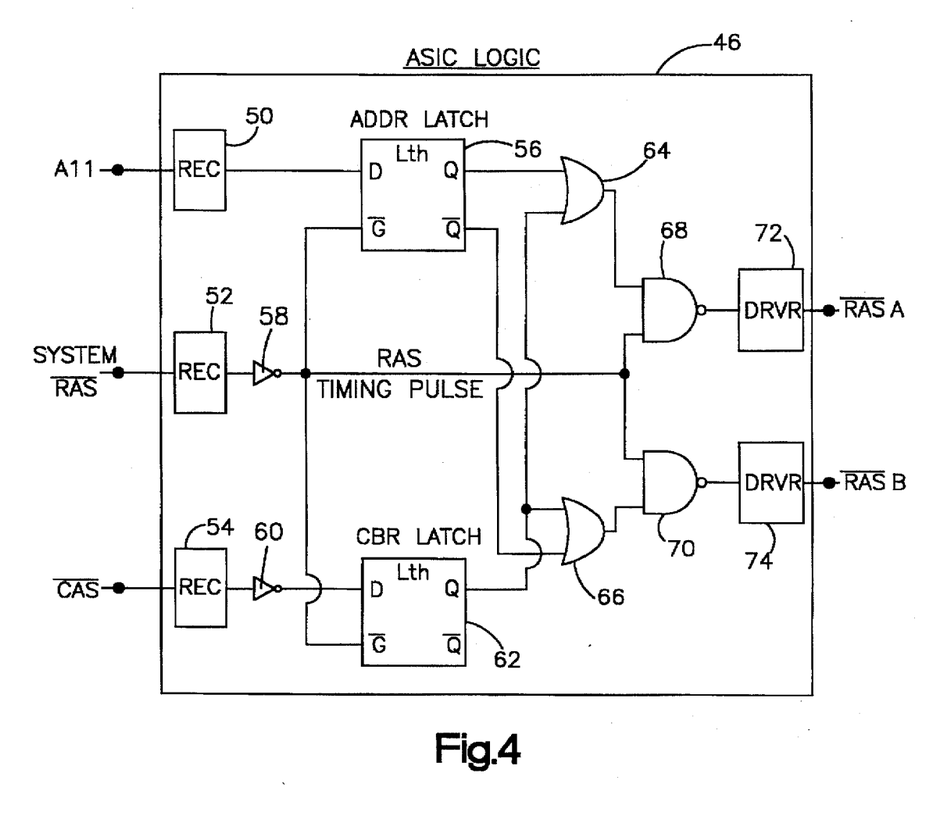
FIG. 4 is a logic diagram showing the logic on an ASIC chip to convert a signal configuration from a master RAS and a 12/11 address configuration to two memory RAS's independently actuatable during read/write cycles and both actuatable during a CBR refresh cycle.

However, with the 4M×4 chips utilized as shown in FIG. 3, the addressable configuration is 11/11 (i.e., 11 row addresses and 11 column addresses). Moreover, 2 RAS signals are necessary to address the entire actuatable range of this configuration, RAS A being required to actuate one-half of the chip pair, and RAS B being required to actuate the other half of the chip pair as shown in FIG. 3. However, as indicated earlier, the memory controller 20 of the system generates only a single system or master RAS signal, and the memory configuration shown in FIG. 3 cannot operate with just a single RAS signal being delivered to the DIMM or SIMM card since activation of all four chips simultaneously would result in data contention during read operations, and data corruption (in 2 chips) during a write operation—since unique CAS inputs are not available. To remedy this, logic circuitry as shown in FIG. 4 is provided on an ASIC chip 46 which receives the high order address bit A11, as well as the SYS RAS, from the system memory controller 20 and converts them to two RAS actuation signals RAS A and RAS B since the high order address bit A11 generated is not required in the addressing scheme of the chips shown in FIG. 3 as only 11 row addresses are required (A0–A10). Thus, by converting the A11 signal to an additional RAS signal, the necessary second RAS signal can be provided. With the logic on the ASIC chip, RAS A is active when the SYS RAS is actuated and the high order bit A11 is "0", and RAS B is active when SYS RAS is actuated and the high order bit A11 is a "1". RAS A will then activate devices 40a–40r, and RAS B will activate devices 40s–40jj. Thus, because the address scheme of the 4M×4 DRAMs shown in FIG. 3 is 11/11, rather than the 12/11 of the 8M×8 DRAMs as shown in FIG. 2, the high order address bit can be converted to a second RAS signal which is actuated by the system or master RAS signal generated by the memory controller 20 when the high order bit is a "1," thus effectively providing the two RAS signals required by the 4M×4 configuration of the chips as shown in FIG. 3. The above activation of RAS A and RAS B is with respect to read or write cycles. Logic provides activation of both RAS A and RAS B during a refresh cycle as will be explained presently.

Referring now to FIG. 4, the logic on ASIC chip 46 to convert the high order address bit A11 to a second RAS signal is shown. As shown in FIG. 4, signals from the memory controller 20 are delivered to the ASIC chip 46, the high order bit A11 being delivered to a receiver 50, the master or SYS RAS signal being delivered to a receiver 52, and the CAS signal being delivered to receiver 54, all on the ASIC chip 46. The output of the receiver 50 is provided as one input to an address latch 56; the output of the receiver 52 is provided as one input to inverter 58; the output of receiver 54 is provided as one input to inverter 60. The output of inverter 60 is provided as one input to CBR (CAS Before RAS) latch; the output of inverter 58 is provided as inputs to the address latch 56 and the CBR latch 62. One output from the address latch 56 is provided as one input to OR gate 64, the other output of the address latch 56 is provided as one input to OR gate 66. The other input to OR gates 64 and 66 is provided as the output from CBR latch 62. The output from the OR gate 64 is provided as one input to NAND gate 68, and the output from OR gate 66 is provided as one input to NAND gate 70. The other inputs to each of the NAND gates 68 and 70 are provided by the output of inverter 58. The outputs from the NAND gates 68 and 70 are provided as inputs to drivers 72 and 74, respectively, the outputs of which are used to provide RAS A and RAS B signals for actuation of the DRAM chips as shown in FIG. 3.

The purpose of the CBR latch is to assure that, on a refresh cycle, both banks of the SIMM can be refreshed when the refresh cycle is a CBR refresh cycle, as will be explained later in conjunction with the description of the refresh cycle.

The operation of the circuit of FIG. 4 is as follows: In the present design, the RAS and CAS signals are designed to be active LOW (as indicated by the bar over the designations). When the system or master RAS goes active and becomes LOW, it is delivered to the receiver 52, which provides an output to inverter 58, which provides a HIGH signal to NAND gates 68 and 70. Thus, if the other input to NAND gate 68 is HIGH, the NAND gate 68 will output an active LOW signal, and if the other input to NAND gate 70 is HIGH, the NAND gate 70 will output an active LOW signal.

First, assume the case that address bit A11 is a "1". This value will be latched in the address latch 56. (Once the value has been latched in the address latch 56, the address bit A11 is freed and not required to stay in its state during the entire operation.) Since the value received in the address latch is a "1", the address latch 56 will output a HIGH signal to the OR gate 64. (A low level on G̅ will cause D input to propagate to Q output.

A high level will latch the state of D and reflect this on Q.) Since this is a HIGH signal, the OR gate will output a HIGH signal to NAND gate 68. Since the system or master RAS is LOW, the inverter 58 outputs a HIGH signal to NAND gate 68. Thus, the NAND gate 68 having two HIGH inputs, outputs a LOW active RAS A signal. Since the Q output from the address latch 56 to the OR gate 64 is HIGH, the inverted or Q̅ output to the OR gate 66 is LOW. Moreover, since the CBR latch is not actuated (for a reason which will be described presently), neither of the inputs to OR gate 66 are HIGH, and thus the NAND gate 70 receives a HIGH input from the SYS RAS but a LOW input from the OR gate 66, and thus the output from the NAND gate 70 is HIGH which means that RAS B provided by the driver 74 is HIGH and thus not active. Hence, when the SYS RAS goes active and A11 is a "1", RAS A will be outputted as an active RAS signal to the chip, and RAS B will not be active.

Next, assume that high order address bit A11 is a "0", and the master RAS signal is active low. When the "0" is latched into the address latch 56, the Q output is LOW to OR gate 64. Also since the output from the CBR latch at this point is LOW (which will be explained presently), the output from the OR gate 64 is LOW, providing one LOW input to NAND gate 68. Since one of the inputs to NAND gate 68 is LOW, the output will be HIGH, thus constituting a HIGH RAS A which is not an active RAS. At the same time a output from address latch 56 is provided to OR gate 66 as a HIGH signal (this being the inverse of the output of the Q signal at latch 56). Thus, since one of the inputs to the OR gate 66 is HIGH, the output from the OR gate 66 will be HIGH to NAND gate 70. Since the master or SYS RAS signal is active LOW providing the HIGH output from inverter 58 as the other input to NAND gate 70, a LOW output from the NAND gate 70 is generated constitutes an active RAS B from the driver 74.

Thus, when address bit A11 is a "1" and SYS RAS is actuated, RAS A will be actuated. When address bit A11 is a "0" and the SYS RAS is actuated, RAS B will be actuated.

It is to be understood that the foregoing description has been described as it relates to read/write cycles and not refresh cycles. In a CBR refresh cycle (which is the CAS signal falling low before RAS falls LOW) when the CAS signal falls LOW and it falls before RAS, this will be latched in CBR latch 62, and outputted as a HIGH signal from latch 62 to both OR gates 64 and 66. The HIGH signals from OR gates 64 and 66 are outputted as HIGH signals to NAND gates 68 and 70. When SYS RAS then falls, the inverter 58 will provide HIGH signals as the other inputs of NAND gates 68 and 70, thus producing active LOW output from both NAND gates 68 and 70 which will actuate both RAS A and RAS B as active LOW through drivers 72 and 74.

Thus, the input to the SIMM or DIMM configuration shown in FIG. 3 is such that when system or master RAS goes active on a read or write cycle, if the high order address bit A11 is a "1", RAS A will be actuated; if the high order address bit A11 is a "0", RAS B will be actuated. If the cycle is a CBR refresh cycle characterized by the CAS becoming active before RAS, both RAS A and RAS B will be actuated for refresh operation.

What has been described above is essentially what was described in said application Ser. No. 08/598,857, wherein the architecture is a one bank 8 meg.×8 configuration being replaced by a two bank 4 meg.×4 configuration. The present invention herein utilizes a 16 meg.×4 configuration where a single bank of 18 16 meg.×4 DRAM chips is replaced by four banks of 18 4 meg.×4 DRAM chips.

Figure 5:
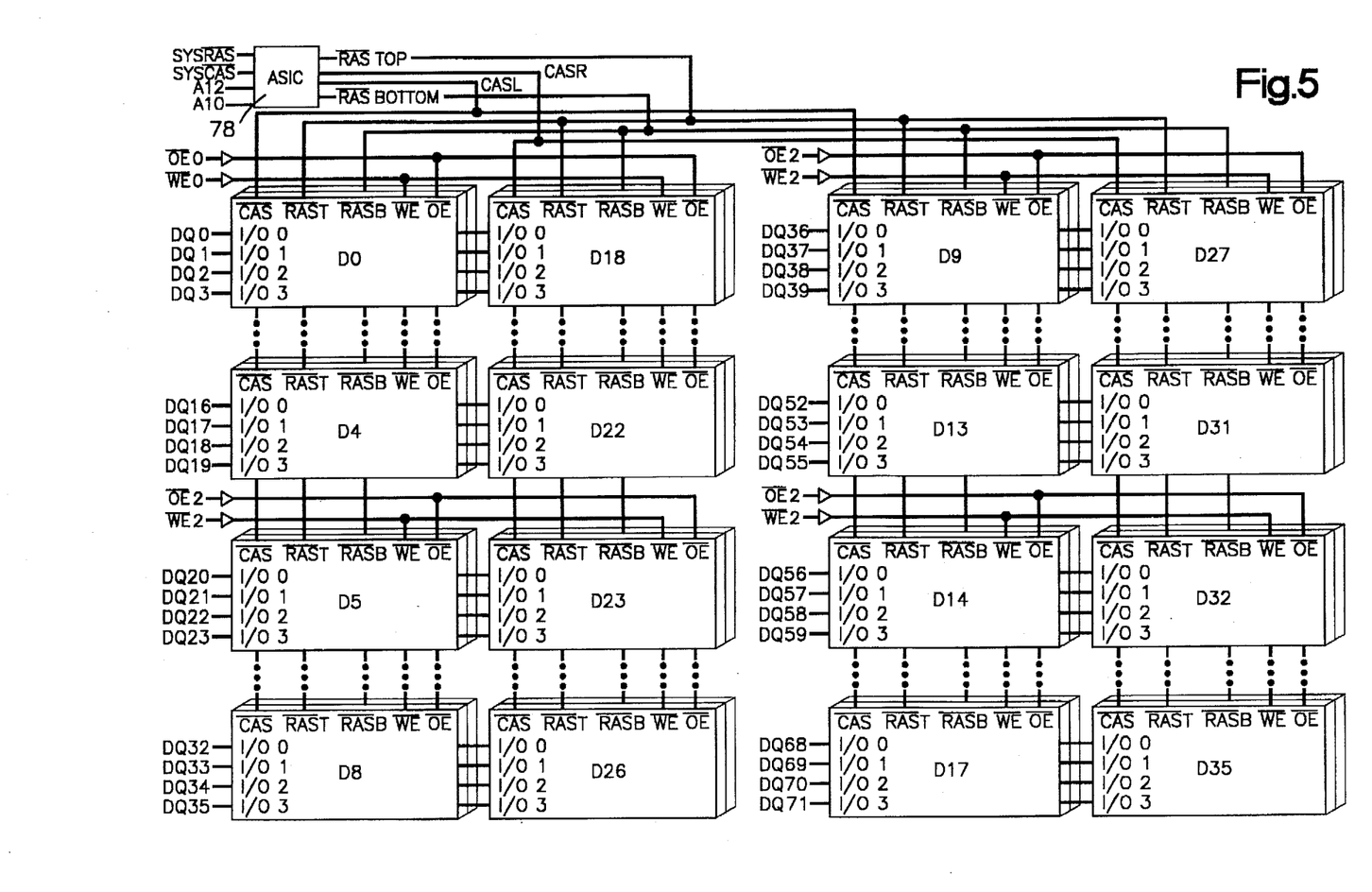
FIG. 5 is a block diagram, somewhat schematic, showing the use of 72 4M×4 chips in stacked configuration on a DIMM using an address configuration of 11/11 to achieve 64 megabytes storage capacity and using two separate RAS signals corresponding to the top and bottom chip in the stack and two separate CAS activation signals corresponding to the left and right sides.
Figure 6:
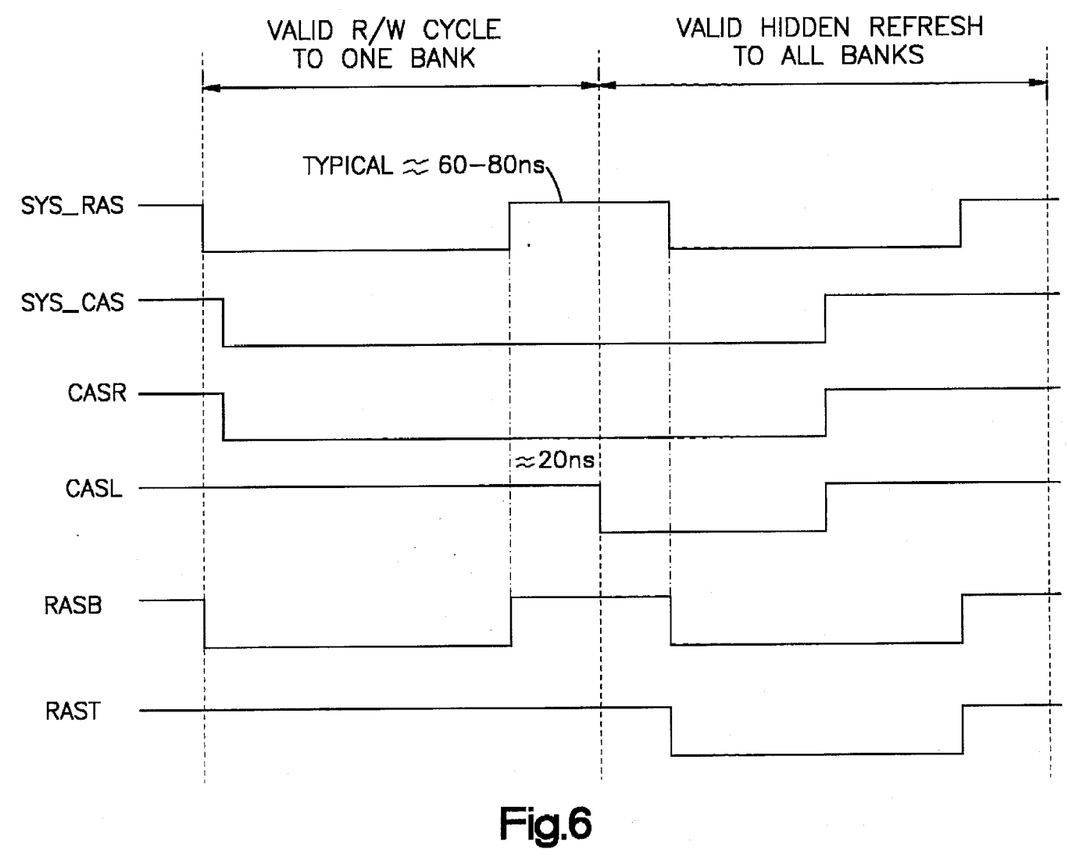
FIG. 6 is a timing diagram of the signals for actuating the DRAM chips of FIG. 5 for a hidden refresh operation.
Figure 7:
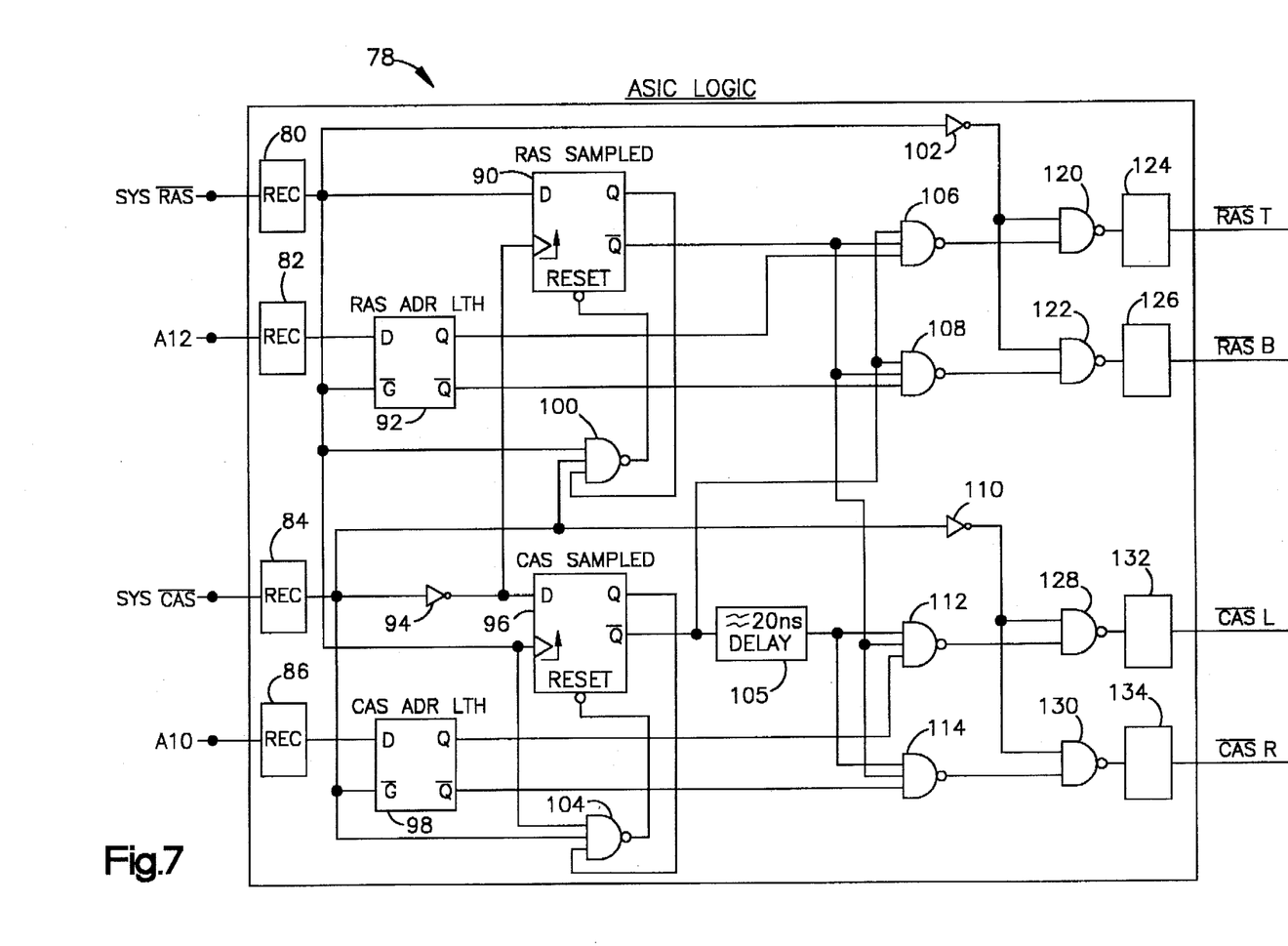
FIG. 7 is a logic diagram showing the logic on an ASIC chip for converting the signal configuration from a system RAS and a system CAS to two separate RAS's and two separate CAS's, and allowing for both CBR refresh and hidden refresh.

Referring now to FIGS. 5, 6 and 7, an embodiment of the invention is shown wherein the DRAMs are organized such that a single SYS RAS per address space or pluggable socket is converted into two different RAS's, and further the system CAS (SYS CAS) is also converted into two separate CAS's and wherein the logic allows for both a conventional CBR (CAS before RAS) refresh and also a hidden refresh. The conventional CBR has been described previously and need not be described in detail here. With respect to the hidden refresh, certain DRAM cards on a system are configured so as to provide what is known as a hidden refresh. In a hidden refresh, at the completion of either a read or write cycle, the RAS goes inactive HIGH as is conventional at the end of a read or write cycle, but the CAS is maintained active LOW. After a certain period of time, normally 60-80 nanoseconds, RAS is again driven LOW, CAS still remaining LOW, and since the CAS is remaining LOW and the RAS goes LOW, a refresh will be performed. This hidden refresh works quite well in a configuration where the SYS CAS is converted to a CAS on the DRAM card for all of the CAS lines. However, in certain configurations, the SYS CAS is converted to two separate CAS's, one known as CAS left (CAS L) and the other known as CAS right (CAS R), to read and write to certain configurations of DRAMs on a card as is well known. In normal read or write operations, only the CAS left or CAS right signal is active during the read/write operation when the RAS is active. Thus, when a hidden refresh is performed, normally only the CAS that has been active will be held active, and thus when RAS goes active, the refresh can occur only through the left or right configuration of the DRAMs, depending upon which CAS has been active during the read/write cycle. It is necessary, however, in a hidden refresh to have all of the CAS lines active during the hidden refresh so that refresh can take place to any chip, irrespective of where it is located. During refresh, there are no concerns with data contention or corruption because no data is transferred into or out of the DRAMs.

FIG. 5 is a block diagram showing a DRAM card wherein a master or SYS RAS is received and converted to two separate output RAS's, and a SYS CAS is received and converted to two separate CAS's, and the configuration of the DRAM chips on the DRAM card is shown which utilizes the two different RAS's and two different CAS's for read/write operations. This is to emulate the operation of a multiplexed 13-pin RAS signal (pin A0-12) and 11-pin CAS signal (pins A0-A10) DRAM chip using multiplexed 12-pin RAS signal (pins A0-A11) and 10-pin CAS signal (pins A0-A9) Thus, the high order pin for the RAS signal (pin A12) and high order pin for the CAS signal (pin A10) are not valid DRAM addresses. As can be seen in FIG. 5, there are a plurality of DRAM chips. The DRAM chips are arranged in four rows of stacked configurations of chips. The first row includes DRAM chips D0-T and D0-B (T representing DRAM top and B representing DRAM bottom) through D8-T and D8-B. All of the chips receive a CAS, RAS, write enable (WE) and output enable (OE) signal, as well as others, plus data input. The second row of DRAM chips designated as D18-T and D18-B through D26-T and D26-B is arranged adjacent to the first row. A third row of DRAM chips designated as D9-T and D9-B through D17-T and D17-B is arranged adjacent to the second row of chips. A fourth row of chips, D27-T and D27-B through D35-T and D35-B, is located adjacent the third row of chips. All of the DRAM chips receive their RAS signals and CAS signals from an ASIC chip 78. According to convention, the DRAM chips with the suffix "T" are designated as the top chips and are actuated by a RAS T signal, and those DRAM chips designated by the suffix "B" are the bottom chips and are actuated by a RAS B signal, both from the ASIC chip 78 which is provided from converting the SYS RAS signal together with the input on pin A12 to either the RAS T or RAS B signal which was described previously. The DRAM chips in column one, i.e., chips D0-T and D0-B through D8-T and D8-B, and column three, chips D9-T and D9-B through D17-T and D17-B, are actuated by a CAS left (CAS L) signal, and the chips in columns two and four, i.e., D18-T and D18-B through D26-T and D26-B and D27-T and D27-B through D35-T and D35-B, are actuated by a CAS right (CAS R) signal from the ASIC 78 which results from the SYS CAS being input into the ASIC 78 together with the value on pin A10, which is the high order bit for the CAS signal, to actuate either CAS R or CAS L signal.

During a normal read/write operation, the SYS RAS will become active before the SYS CAS. Whichever RAS (RAS T or RAS B) becomes active followed by whichever CAS (CAS L or CAS R) becomes active, that particular group of chips will be actuated for a read/write operation. For example, if RAS T and CAS L become active, chips D0-T, D1-T, D2-T, D3-T, D4-T, D5-T, D6-T, D7-T, D8-T, D9-T, D10-T, D11-T, D12-T, D13-T, D14-T, D15-T, D16-T and D17-T will be actuated for a read/write operation.

Referring now to FIG. 6, a timing diagram of the SYS CAS, SYS RAS and the CAS's and RAS's coming from the ASIC chip 78 are shown, indicating how hidden refresh is accomplished according to the present invention. A description of the logic to provide these signals will be provided presently with respect to FIG. 7.

As can be seen in FIG. 6, the SYS RAS goes active (in this embodiment the active signal is a LOW signal). Following the SYS RAS going LOW, the SYS CAS goes LOW, indicating a normal read/write cycle. In the illustrated instance, when the SYS RAS goes LOW, the RAS B goes LOW from the ASIC 78 based on the input from pin A12. It is to be understood that in other instances the read could be to the RAS T, however in this case the RAS B is the one selected. Following the SYS RAS going LOW, the SYS CAS goes LOW and, in this instance, the CAS R is selected which goes LOW based on the value on pin A10. CAS L is not selected and stays HIGH or inactive. Again, the left or right could have been selected, but in the instance being described for illustration purposes, the CAS L is deselected. The read or write operation is terminated when the SYS RAS goes HIGH as shown in the diagram; however, if the SYS CAS remains LOW after the SYS RAS has gone high, it indicates that there may be a hidden refresh operation coming. The hidden refresh will take place on all active CAS and RAS lines when the SYS RAS again goes low. Typically, this is 60-80 nanoseconds later, which gives the internal circuitry of the DRAM sufficient time to recharge. When the SYS RAS falls the second time, hidden refresh will be performed on all of the DRAM chips where CAS and RAS are both LOW at the selected addresses. However, as can be seen from the drawings and as was described above, only the CAS R line has been driven LOW or active, while the CAS L line is HIGH or inactive. Therefore, if a hidden refresh is to be performed in this condition, only the chips on CAS R could be refreshed, and not those on CAS L, thereby excluding half of the chips from the refresh operation. In order to provide refresh to all of the chips, the unselected, or in this case the CAS L lines, are driven LOW after the SYS RAS has gone HIGH and before it has been driven LOW again to perform the hidden refresh. In order to prevent unintended results, the CAS L line is driven LOW after the SYS RAS has been held high for about 20 nanoseconds. Also, when the SYS RAS is driven LOW for the hidden refresh, both the RAS B and RAS T lines are also driven LOW so that refresh can be performed on all of the chips. In this instance, the CAS before RAS refresh cycle (CBR) operates in the conventional way and drives all of the lines LOW as was described previously. After the refresh has been completed, the SYS CAS goes HIGH, which drives both the CAS R and CAS L HIGH, completing the refresh operation. When the SYS RAS goes HIGH or inactive, the RAS B and RAS T lines are also driven HIGH or inactive, ready for the next cycle.

The logic for performing read/write, CAS before RAS and hidden refresh operations is shown on ASIC chip 78 in FIG. 7. The inputs are SYS RAS, the value on pin A12, SYS CAS and the value on pin A10. As was indicated earlier, the signal from pin A12 is either HIGH or LOW and is used to convert the master RAS (or SYS RAS) to a RAS T or RAS B. Similarly, the address bit on pin A10 is used to convert the SYS CAS into a CAS L or CAS R signal, which will be described with respect to the logic. The SYS RAS signal is delivered to receiver 80, pin A12 is connected to receiver 82, SYS CAS signal is delivered to receiver 84, and the address on pin A10 is delivered to receiver 86. The receivers 80, 82, 84 and 86 are used to convert system signals to the proper signals for use on the ASIC chip 78.

The signal from the receiver 80 is delivered as one input to a RAS sample latch 90. This latch 90 is, by construction, a D flip/flop. This latch will determine whether the cycle is a CBR or not. If the cycle is a CBR, the refresh will be done as a CBR. If it is not, the cycle will be treated as a normal read/write cycle with RAS before CAS. The signal from the receiver 82 is delivered to the D pin of RAS address latch 92. The signal from receiver 84 is delivered as input to inverter 94, the output of which is delivered to the D pin of a CAS sample latch 96 which also is a D flip/flop and determines the possibility of a hidden refresh. The output from receiver 86 is delivered to the D pin of CAS address latch 98.

The output from receiver 80 is also provided as input to inverter 102 and applied to the $\overline{G}$ pin of the RAS address latch 92 and to the rising edge clock pin of the CAS sample latch 96. The output from receiver 80 is also applied as one input to a three input NAND gate 100. The output from inverter 94 is applied as the input to the rising edge clock pin of the RAS sample latch 90, as well as to the D input of the CAS sample latch 96. The Q output from the latch 90 is applied as another input to NAND gate 100 and the third input to the NAND gate 100 is from the receiver 84. The output from receiver 80 is also supplied as one input to NAND gate 104, and the output from receiver 84 is applied as another input to NAND gate 104, as well as input to $\overline{G}$ pin of the latch 98, and the third input to NAND gate 104 is from the Q output pin of the latch 96.

The $\overline{Q}$ output from the latch 96 is supplied as an input to a 20-nanosecond delay circuit 105. The output of $\overline{Q}$ pin of latch 96 is also supplied as one input to three-input NAND gate 106 and one input to three-input NAND gate 108. The second input to NAND gates 106 and 108 is from $\overline{Q}$ pin on latch 90. A third input to NAND gate 106 is from Q pin on latch address 92, and a third input to NAND gate 108 is provided from $\overline{Q}$ pin on latch 92. The output from the receiver 84 is also provided as an input to inverter 110. The output from $\overline{Q}$ pin on latch 90 is also provided as one input to three-input NAND gate 112 and one input to three-input NAND gate 114. The output from the 20 nanosecond delay circuit 105 is provided as a second input to both NAND gates 112 and 114. The third input to NAND gate 112 is from the Q pin on the latch 98. The third input to NAND gate 114 is provided from the Q pin on latch 98. The outputs from inverter 102 and NAND gate 106 are provided as inputs to two-input NAND gate 120, and the output from inverter 102 and NAND gate 108 are provided as inputs to two-input NAND gate 122. The output from NAND gate 120 is provided as input to driver 124 which provides the RAS T or RAS top signal. The output from NAND gate 122 provides the input to driver 126, which output provides the RAS B or RAS bottom signal output. The output from inverter 110 provides one input to each of the NAND gates 128 and 130. The output from NAND gate 112 provides the other input to NAND gate 128. The output from NAND gate 114 provides the other input to NAND gate 130. The output from NAND gate 128 provides the input to driver 132, which provides as an output the CAS L or CAS left signal, and the output from gate 130 provides the input to driver 134, the input of which provides the CAS R signal.

The output from NAND gate 100 is provided as a reset to the reset pin on latch 90, and the output from NAND gate 104 is provided as input to the reset pin on latch 96.

OPERATION OF THE LOGIC CIRCUIT OF FIG. 7

In describing the operation of the logic circuit of FIG. 7, it should be remembered that the particular configuration for which this logic was designed is when SYS RAS and SYS CAS are active LOW. Also, it should be understood that the latches 90 and 96 are D flip-flops and as such latch on the Q output the value that was on the D input on the detection of a rising edge pulse of the signal supplying the rising edge clock pin to that latch. In the case of the RAS sampled latch 90, the rising edge clock pin would be from the SYS CAS through inverter 94, and on the latch 96 it would be from the SYS RAS.

Normal Read/Write Operation

Referring now to the logic, a normal read or write cycle will be described first. On a read or write cycle, the SYS RAS signal will become active or fall before the SYS CAS signal becomes active. Therefore, when the RAS signal falls, it is received by the receiver 80 and is provided as input to inverter 102, the output of which will provide one HIGH input to NAND gate 120 and a LOW signal to $\overline{G}$ pin of latch 92 and D pin of latch 90. The output from pin $\overline{Q}$ of latch 90 to NAND gates 106, 108, 110 and 112 is HIGH because at the end of every cycle the latches 90 and 96 are reset as will be described presently. However, the A12 line has either a 1 or a 0 on it. If it is a 1, the Q-pin will output a HIGH signal to NAND gate 106 and the $\overline{Q}$ pin will output a LOW signal to NAND gate 108. Thus, since NAND gate 108 has one LOW signal, it will provide a HIGH signal output therefrom to NAND gate 122 which, coupled with the HIGH output from inverter 102, actuates the RAS B line. Thus, the RAS B line is actuated ready and waiting for the CAS actuation.

The CAS actuation is as follows. When the SYS CAS falls, inverter 94 inverts the signal and provides a HIGH input to latch 96. The LOW SYS CAS through inverter 110 will provide a HIGH signal to NAND gates 128 and 130. The A10 line has either HIGH or LOW, i.e., it has a 1 or a 0 on it. If it has a 1, the output from the $\overline{Q}$ is LOW to NAND gate 114, which will result in a positive output to NAND gate 130 which will thus actuate CAS R. Therefore, a RAS T and a CAS R read/write operation has been initiated. During the normal read or write operation, when the RAS T and CAS R are actuated, all of the inputs to NAND gates 108 and 112 are HIGH, thus providing an inverted LOW signal out to gates 122 and 128 and thus rendering these gates nonactive.

A similar analysis for read/write cycles can be performed for all four combinations of A10 HIGH and LOW and A12 HIGH and LOW, thus giving the possibility of a read/write cycle to one of four different quadrants of chips.

CBR Refresh

Next, assume that a CBR refresh cycle (not a hidden refresh) is initiated. In this case, the SYS CAS falls or becomes active before the SYS RAS falls. In such a case, the SYS CAS after falling provides a HIGH signal to NAND gates 128 and 130 through inverter 110, which provides one HIGH input to NAND gate 128 and one HIGH input to NAND gate 130. The falling SYS CAS also provides a rising edge to the clock input pin of the latch 90. Because the SYS RAS input has not fallen yet, a HIGH is present at the D input to latch 90, and therefore the HIGH value is latched on the Q pin of latch 90. This HIGH value is outputted as a LOW input to NAND gates 106, 108, 112 and 114 from $\overline{Q}$ pin of latch 90, thus providing positive inputs to NAND gates 120, 122, 128 and 130. Also, when CAS goes LOW, the other input to the NAND gates 128 and 130 will go HIGH from the signal delivered from inverter 110 which will then drive the CAS L and CAS-R both LOW or active. As soon as SYS RAS goes LOW, the inputs to gates 120 and 122 will go HIGH, providing the other HIGH input necessary for the RAS T and RAS B signals to go active. When SYS RAS goes LOW or active, RAS T and RAS B are active and CAS L and CAS R have already gone active; thus, all of the RAS's and CAS's are active as necessary for the CBR refresh.

Hidden Refresh

As indicated earlier, a hidden refresh takes place at the end of a read or write cycle, and is accomplished by leaving the SYS CAS active when the SYS RAS goes inactive and maintaining the SYS CAS active until after the SYS RAS goes active again. The hidden refresh is accomplished as follows.

It will be remembered that just before the end of a normal read/write cycle, the SYS RAS is active and either RAS T or RAS B is active, and the SYS CAS is active and either the CAS L or CAS R is active. At the termination of the read or write cycle, the SYS RAS goes inactive. Since this will remove the HIGH signal from the NAND gates 120 and 122, RAS T and RAS B will both go inactive. However, SYS CAS is LOW or active when SYS RAS goes inactive or HIGH, and the rising edge of the RAS pulse is sensed in the latch 96, latching onto Q the value there. Since CAS is active, the inverter 94 has placed a HIGH signal on the D pin of the latch 96. This HIGH signal is output as a LOW signal on the $\overline{Q}$ pin to the 20 nanosecond delay circuit 105. At the conclusion of this 20 nanosecond delay, this LOW signal is applied to NAND gates 112 and 114, thus outputting a HIGH signal as one input to NAND gates 128 and 130, respectively. Since the SYS CAS is LOW, the inverter 110 provides the other HIGH signals to each of NAND gates 128 and 130, thus providing an active CAS L and CAS-R. When the SYS RAS falls, after about 60 to 80 nanoseconds as previously described, inverter 102 provides a HIGH signal to one gate of each of the NAND gates 120 and 122. The $\overline{Q}$ output pin from latch 96 also provides LOW signals to NAND gates 106 and 108. Thus, the output from NAND gates 106 and 108, when $\overline{Q}$ is LOW, is a HIGH signal to gates 120 and 122, respectively. When SYS RAS then again goes LOW, the other HIGH outputs are provided to NAND gates 120 and 122 from inverter 102, thus driving RAS T and RAS B active. Since CAS L and CAS R have already been driven active, a valid hidden refresh operation can take place to all the DRAMs on the DIMM.

At the end of every DRAM cycle, both RAS and CAS return to inactive HIGH. This will cause receivers 80 and 84 to apply a HIGH signal to two inputs of both three-input NAND gates 100 and 104. If the RAS sampled latch 90 is set (i.e., Q is HIGH), the third input of gate 100 will go high, causing the output to go LOW, which resets latch 90. If the CAS sampled latch 96 is set (i.e., Q is HIGH) then the third input of gate 104 goes HIGH, causing the output to go LOW and resetting latch 96. Thus, at the end of any cycle, when RAS and CAS have both returned inactive HIGH, both the RAS sampled latch 90 and the CAS sampled latch 96 are automatically reset if they were set during the previous cycle. The ADR latches 92 and 98 contain only data, not state information, and therefore do not have to be reset.

Accordingly, the preferred embodiments of the present invention have been described. With the foregoing description in mind, however, it is understood that this description is made only by way of example, that the invention is not limited t6 the particular embodiments described herein, and that various rearrangements, modifications, and substitutions may be implemented without departing from the true spirit of the invention as hereinafter claimed.

What is claimed is:

1. A method of controlling the operation of memory in a computer system with signals from a memory controller which outputs Y row address bits and a single system RAS signal per address space or pluggable socket and X column address bits and a single CAS signal, and wherein said memory is comprised of DRAM chips having Y–1 bit row addresses and X–1 column addresses, and is divided into RAS signals respectively, and is divided into first and second CAS sections actuated by first and second CAS signals, said method comprising the steps of:

providing said system RAS signal to said memory during a read or write operation as a first active memory RAS signal when and only when the high order address bit of said row address signal is a first value;

providing the high order bit of said Y address as a second memory RAS signal which becomes active during a read or write operation when and only when said high order bit of said row address is a second value;

providing said system CAS signal to said memory during a read or write operation as a first active memory CAS signal when and only when the high order address bit of said column address signal is a first value;

providing the high order bit of said X address as a second memory CAS signal which becomes active during a read or write operation when and only when said high order bit of said column address is a second value; and providing both said first and second memory RAS signals and first and second CAS signals to memory during a refresh operation.

2. The invention as defined in claim 1, wherein said refresh operation is performed as a CAS Before RAS refresh.

3. The invention as defined in claim 1, wherein said refresh operation is performed as a hidden refresh.

4. The invention as defined in claim 1, wherein the refresh is performed as either a CBR or hidden refresh.

5. A computer system comprising:

a memory controller which outputs Y row address bits and a single system RAS signal per address space or pluggable socket, and X column address bits and a single CAS signal;

memory including DRAM chips having Y–1 bit row addresses and X–1 bit column addresses;

logic circuitry to receive said master RAS signal and the high order address bit of said row address from said memory controller and generate a first memory active RAS signal responsive to said master RAS signal becoming active when and only when said high order bit of said row address has a first value during read/ write operations, and generate a second memory RAS active signal when said master RAS is active and when and only when said high order bit of said row address is a second value during read/write operations;

providing said system CAS signal to said memory during a read or write operation as an active memory CAS signal when and only when the high order address bit of said column address signal is a first value;

providing the high order bit of said X address as a second memory CAS signal which becomes active during a read or write operation when and only when said high order bit of said column address is a second value;

providing both said first and second memory RAS signals and first and second CAS signals to memory during a refresh operation;

to receive said master CAS signal and the high order address bit of said column address from said memory controller and generate a first memory active CAS signal responsive to said master CAS signal becoming active when and only when said high order bit of said column address has a first value during read/write operations, and generate a second memory CAS active signal when said master CAS is active and when and only when said high order bit of said column address is a second value during read/write operations; and said logic circuit having circuitry to generate both memory RAS signals and both memory CAS signals active during a refresh cycle when said system RAS is active.

6. The invention as defined in claim 5, wherein said logic circuitry includes circuitry to drive both memory CAS signals active during a CBR refresh.

7. The invention as defined in claim 5, wherein said logic circuitry includes circuitry to drive both memory CAS signals active during a hidden refresh.

8. The invention as defined in claim 5, wherein said logic circuitry is disposed on an integrated circuit chip.

* * * * *